(12) United States Patent
Uno et al.

(10) Patent No.: US 10,701,811 B2
(45) Date of Patent: Jun. 30, 2020

(54) SURFACE-TREATED COPPER FOIL, AND COPPER-CLAD LAMINATE AND PRINTED WIRING BOARD USING SAME

(71) Applicants: FURUKAWA ELECTRIC CO., LTD., Tokyo (JP); MURATA MANUFACTURING CO., LTD., Kyoto (JP)

(72) Inventors: Takeo Uno, Tokyo (JP); Yuko Okuno, Tokyo (JP); Takahiro Tsuruta, Tokyo (JP); Yoshimasa Nishi, Kyoko (JP); Sunao Fukutake, Kyoto (JP)

(73) Assignees: Furukawa Electric Co., Ltd., Tokyo (JP); Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 16/586,062

(22) Filed: Sep. 27, 2019

(65) Prior Publication Data
US 2020/0029444 A1    Jan. 23, 2020

Related U.S. Application Data

(63) Continuation of application No. PCT/JP2018/013279, filed on Mar. 29, 2018.

(30) Foreign Application Priority Data

Mar. 30, 2017  (JP) .................... 2017-068293

(51) Int. Cl.
*H05K 1/02* (2006.01)
*H05K 3/00* (2006.01)
(Continued)

(52) U.S. Cl.
CPC ......... *H05K 3/4655* (2013.01); *H05K 1/0237* (2013.01); *H05K 3/0064* (2013.01);
(Continued)

(58) Field of Classification Search
CPC ....... B32B 15/08; B32B 15/01; C22C 19/002; C22C 19/03; C23C 18/1646; C25D 1/04;
(Continued)

(56) References Cited

U.S. PATENT DOCUMENTS 6,280,641 B1    8/2001  Gaku et al.
2005/0175826 A1*  8/2005  Suzuki ................. C25D 1/04
                                                          428/209

(Continued)

FOREIGN PATENT DOCUMENTS

JP    H11284309 A    10/1999
JP    2000049464 A    2/2000
(Continued)

OTHER PUBLICATIONS

International Search Report and Written Opinion received in PCT/JP2018/013279 dated Jun. 5, 2018 (Engl. Translation of ISR only).
(Continued)

*Primary Examiner* — Timothy J Thompson
*Assistant Examiner* — Guillermo J Egoavil
(74) *Attorney, Agent, or Firm* — Dorsey & Whitney LLP

(57) ABSTRACT

A surface-treated copper foil of the present disclosure includes a copper foil substrate, at least one surface of which has a surface treatment coat including at least a roughening-treated surface on which roughening particles are formed. Observation of a cross-section of the surface-treated copper foil with a scanning electron microscope shows that on a surface of the surface treatment coat, a standard deviation of the particle height of the roughening particles is 0.16 μm or more and 0.30 μm or less, and an average value of the ratio of the particle height to the particle width (particle height/particle width) of the roughening particles is 2.30 or more and 4.00 or less.

20 Claims, 6 Drawing Sheets

(51) Int. Cl.
    *H05K 3/42*     (2006.01)
    *H05K 3/46*     (2006.01)
    *H05K 1/03*     (2006.01)
    *C25D 5/16*     (2006.01)
    *C25D 1/04*     (2006.01)
    *C25D 7/06*     (2006.01)
    *B32B 15/08*     (2006.01)

(52) U.S. Cl.
    CPC .............. *H05K 3/429* (2013.01); *B32B 15/08* (2013.01); *C25D 1/04* (2013.01); *C25D 5/16* (2013.01); *C25D 7/06* (2013.01); *H05K 1/03* (2013.01)

(58) Field of Classification Search
    CPC .......... C25D 5/16; C25D 7/06; H05K 1/0237; H05K 1/03; H05K 1/02; H05K 1/09; H05K 3/0064; H05K 3/429; H05K 3/4655; H05K 3/00; H05K 3/42; H05K 3/46; H05K 3/384; H05K 3/389; H05K 2201/0355; Y10T 428/12993; Y10T 428/31678
    USPC ........ 174/258, 257; 428/687, 457; 427/97.1, 427/97.6
See application file for complete search history.

(56) References Cited

U.S. PATENT DOCUMENTS

2012/0189859 A1* 7/2012 Nozaki .................. B32B 15/08
    428/458
2012/0285734 A1* 11/2012 Uno ........................ B32B 15/01
    174/257
2013/0040162 A1* 2/2013 Fujisawa ................ B32B 15/01
    428/607

FOREIGN PATENT DOCUMENTS

| | | |
|---|---|---|
| JP | 2005219379 A | 8/2005 |
| JP | 2011168887 A | 9/2011 |
| JP | 2015147978 A | 8/2015 |
| WO | 2012020818 A1 | 2/2012 |
| WO | 2014196576 A1 | 12/2014 |
| WO | 2016035876 A1 | 3/2016 |
| WO | WO-2016035876 A1 * 3/2016 ............ B32B 15/08 |
| WO | 2016117587 A1 | 7/2016 |
| WO | 2017026490 A1 | 2/2017 |

OTHER PUBLICATIONS

English translation of the International Preliminary Report on Patentability received in PCT/JP2018/013279 dated Oct. 1, 2019.
English translation of the Written Opinion of the International Search Authority received in PCT/JP2018/013279 dated Jun. 5, 2018.

* cited by examiner

SURFACE-TREATED COPPER FOIL, AND COPPER-CLAD LAMINATE AND PRINTED WIRING BOARD USING SAME

CROSS REFERENCE TO RELATED APPLICATIONS

The present application is a continuation application of International Patent Application No. PCT/JP2018/013279 filed on Mar. 29, 2018, which claims the benefit of Japanese Patent Application No. 2017-068293, filed on Mar. 30, 2017. The contents of these applications are incorporated herein by reference in their entirety.

BACKGROUND

Technical Field

The present disclosure relates to a surface-treated copper foil, particularly a surface-treated copper foil suitable for a printed wiring board to be used in a high-frequency band. Further, the present disclosure relates to a copper-clad laminate sheet and a printed wiring board using the surface-treated copper foil.

Background

In recent years, for keeping up with enhancement of information processing speeds in electronic devices, high-speed wireless communication and the like, high-speed transmission of electric signals has been required for electronic circuit boards, and application of high-frequency circuit boards has expanded.

For high-frequency circuit boards, it is necessary to reduce transmission loss for high-speed transmission of electric signals. Examples of methods for reducing transmission loss include methods in which a resin base material is reduced in dielectric constant and reduced in dielectric tangent, and methods in which transmission loss is reduced in circuit wiring (particularly copper foil) that is a conductor. In particular, examples of the methods for reducing the dielectric constant and reducing dielectric tangent of a resin base material include methods in which a resin having a low dielectric constant and dielectric tangent (for example a liquid crystal polymer) is selected. In this case, however, it is difficult to obtain chemical adhesion even when a coupling agent or the like is used, depending on the type of a resin. Further, examples of the methods for reducing transmission loss in a copper foil include methods in which surface irregularities of roughening particles and the like are reduced in size, but in this case, it becomes difficult to obtain physical adhesion (anchoring effect).

Thus, heretofore, methods have been generally employed in which a resin base material is reduced in dielectric constant and reduced in dielectric tangent, and adhesion is obtained by irregularities on a copper foil surface. For example, Japanese Patent Application Laid-Open No. 2005-219379 discloses a method in which the surface roughness and the brightness value (luminance) of a copper foil are adjusted for enhancing adhesion with a liquid crystal polymer film. International Publication No. WO 2012/020818 discloses a method in which the height and the aspect ratio of a roughening particle is adjusted for enhancing adhesion with a liquid crystal polymer film. According to Japanese Patent Application Laid-Open No. 2005-219379 and International Publication No. WO 2012/020818, adhesion with a liquid crystal polymer film can be enhanced by increasing the size of irregularities on a copper foil surface, but a request level of lower transmission loss which has been required in recent years is not sufficiently achieved.

In the meantime, for high-frequency circuit boards, reduction of transmission loss and enhancement of adhesion have been heretofore considered important, and with downsizing and thinning of electronic devices, development of highly integrated, small and dense printed wiring boards is required for various electronic components to be used particularly for mobile devices typified by mobile phones.

In such small and dense wiring, a blind via hole may be used for interlayer connection, and in an increasing number of production processes, a via hole is formed by laser irradiation. FIG. 5 shows an example of a process for forming a blind via hole by laser irradiation.

As shown in FIG. 5, in formation of a blind via hole by laser irradiation, a metal originating from a copper foil 11 and a resin originating from a resin base material 13 may be retained on a bottom part 40 of the blind via hole after processing by irradiation of a laser 30 (FIG. 5B). If these retained materials 20 cannot be removed even by desmear treatment (FIG. 5C) performed after laser processing, there may be cases where sufficient continuity is not obtained even by applying plating 15 (FIG. 5D), and thus connection reliability in interlayer connection is deteriorated.

Methods for attaining both adhesion with a resin base material and a soft etching property in a blind via hole have been proposed in which a copper foil that the surface roughness, and the width, the height and the aspect ratio of a roughening particle are regulated to suppress retention of a metal originating from the copper foil is used (Japanese Patent Application Laid-Open No. 2011-168887), or a copper foil which suppresses retention of a resin originating from the resin base material is used (Japanese Patent Application Laid-Open No. 11-284309 and Japanese Patent Application Laid-Open No. 2000-049464). In the method in Japanese Patent Application Laid-Open No. 2011-168887, favorable adhesion with the resin base material can be secured due to the shape of the roughening particle, but the resin retained on a bottom part of the blind via hole in laser irradiation is not considered. Thus, connection reliability in interlayer connection is not sufficient for smaller and denser circuit boards in recent years. Further, retention of the resin on the bottom part of the blind via hole in laser irradiation can be suppressed by providing a laser absorbing layer on the surface of the roughening particle as in the method in Japanese Patent Application Laid-Open No. 11-284309 or providing on the surface of the copper foil a blackened layer having a high laser absorption property as in the method in Japanese Patent Application Laid-Open No. 2000-049464. However, the laser absorbing layer or the blackened layer having high transmission loss is retained at an interface between the resin base material and the copper foil in a region other than the blind via hole. Thus, transmission loss increases, so that a request level of lower transmission loss required in recent years is not sufficiently achieved.

SUMMARY

The present disclosure is related to providing a surface-treated copper foil having both favorable adhesion with a resin base material and a favorable high-frequency property in a high-frequency band and having favorable laser processability particularly, and a copper-clad laminate sheet and a printed wiring board using the surface-treated copper foil.

In accordance with one aspect of the present disclosure, a surface-treated copper foil includes a copper foil substrate, at least one surface of which has a surface treatment coat including at least a roughening-treated surface on which roughening particles are formed, wherein observation of a cross-section of the surface-treated copper foil with a scanning electron microscope shows that on a surface of the surface treatment coat, a standard deviation of the particle height of the roughening particles is 0.16 μm or more and 0.30 μm or less, and an average value of a ratio of the particle height to the particle width (particle height/particle width) of the roughening particles is 2.30 or more and 4.00 or less.

In the surface-treated copper foil, it is preferable that on the surface of the surface treatment coat, an average value of the particle height of the roughening particles is 0.50 μm or more and 1.20 μm or less.

In the surface-treated copper foil, it is preferable that on the surface of the surface treatment coat, a standard deviation of the ratio of the particle height to the particle width (particle height/particle width) of the roughening particles is 1.20 or more and 2.00 or less.

In the surface-treated copper foil, it is preferable that on the surface of the surface treatment coat, a luminance is 10.0 or more and 14.0 or less.

In the surface-treated copper foil, it is preferable that the surface-treated copper foil is used for a high-frequency band printed wiring board.

In accordance with another aspect of the present disclosure, a copper-clad laminate sheet includes the surface-treated copper foil.

In the copper-clad laminate sheet, it is preferable that a resin of a resin base material of the copper-clad laminate sheet is a liquid crystal polymer.

In accordance with another aspect of the present disclosure, a printed wiring board includes the copper-clad laminate sheet.

According to the present disclosure, it is possible to obtain a surface-treated copper foil having both favorable adhesion with a resin base material and a favorable high-frequency property in a high-frequency band and having favorable laser processability particularly, and a copper-clad laminate sheet and a printed wiring board using the surface-treated copper foil, where the surface-treated copper foil includes a copper foil substrate, at least one surface of which has a surface treatment coat including at least a roughening-treated surface on which roughening particles are formed, and observation of a cross-section of the surface-treated copper foil with a scanning electron microscope (SEM) shows that on a surface of the surface treatment coat, a standard deviation of the particle height of the roughening particles is 0.16 μm or more and 0.30 μm or less, and an average value of the ratio of the particle height to the particle width (particle height/particle width) of the roughening particles is 2.30 or more and 4.00 or less.

DETAILED DESCRIPTION

Figure 1:
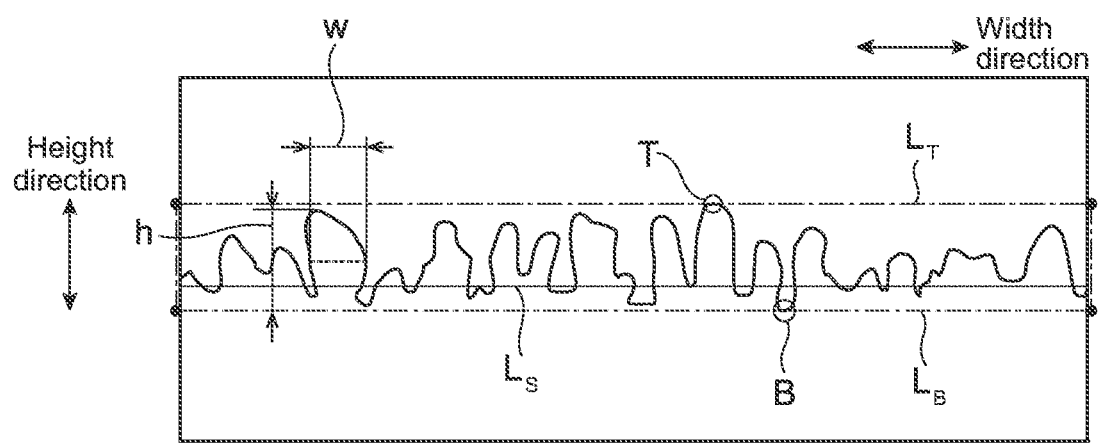
FIG. 1 is a schematic diagram showing a contoured surface shape of a surface treatment coat in cross-sectional observation of a surface-treated copper foil of the present disclosure.

Hereinafter, a preferred embodiment of a surface-treated copper foil of the present disclosure will be described in detail.

The surface-treated copper foil according to the present disclosure includes a copper foil substrate, at least one surface of which has a surface treatment coat including at least a roughening-treated surface on which roughening particles are formed, and observation of a cross-section of the surface-treated copper foil with a scanning electron microscope (SEM) shows that on a surface of the surface treatment coat, a standard deviation of the particle height of the roughening particles is 0.16 μm or more and 0.30 μM or less, and an average value of the ratio of the particle height to the particle width (particle height/particle width) of the roughening particles is 2.30 or more and 4.00 or less.

The surface-treated copper foil of the present disclosure has a copper foil substrate, and a surface treatment coat on at least one surface of the copper foil substrate, the surface treatment coat including at least a roughening-treated surface on which roughening particles are formed. The surface of the surface treatment coat is at least one of the outermost surfaces (front and back surfaces) of the surface-treated copper foil, and the surface of the surface treatment coat is a roughened surface with a minute-irregular surface shape which reflects a formation state, a particle shape and the like of roughening particles formed on at least one surface of the copper foil substrate. The surface of the surface treatment coat (hereinafter referred to as a "roughened surface") may be, for example, a roughening-treated surface with roughening particles formed on the copper foil substrate, or a surface of a silane coupling agent layer formed on the roughening-treated surface directly, or indirectly where intermediate layers such as an underlying layer containing Ni, a thermally stabilizing layer containing zinc (Zn) and a rust-proofing layer containing chromium (Cr) are interposed between the silane coupling agent layer and the roughened surface. When, for example, the surface-treated copper foil of the present disclosure is used for a conductor circuit of a printed wiring board, the roughened surface is a surface (bonding surface) for bonding and laminating a resin base material.

Further, in the present disclosure, a surface of the surface-treated copper foil is cross-sectionally processed using, for example, an ion milling apparatus, and the processed cross-section is observed with a scanning electron microscope (SEM) to analyze a formation state of roughening particles on the roughened surface. Specifically, with an accelerating voltage of 5 kV in the SEM, a secondary electron image is observed at a magnification of 5,000 times. In observation of the cross-section with the SEM, the surface-treated copper foil is horizontally fixed on a smooth support table so that the surface-treated copper foil is not warped or sagged, and the surface-treated copper foil is adjusted so as to make the surface-treated copper foil horizontal within the image of the observed cross-section.

Further, analysis of roughening particles on the roughened surface is performed by analyzing the SEM image obtained in observation of the cross-section. Specifically, a SEM image at a predetermined magnification is processed, and the contour of a surface shape of the roughened surface is extracted as shown in FIG. 1. Next, within the observation visual field (corresponding to the SEM image), the tip end of the highest roughening particle (highest point T) and the lowest valley of gaps between roughening particles (lowest point B) are selected. Further, two parallel lines (highest line $L_T$ and lowest line $L_B$) are drawn perpendicularly to left and right ends in an observation visual field in such a manner as to pass through the highest point T and the lowest point B, and a quadrangle surrounded by four intersections at which these two parallel lines intersect with the left and right ends of the observation visual field is defined as a measurement area.

Further, with regard to adhesion between the surface-treated copper foil and the resin base material, a surface-treated copper foil having roughening particles having a low height has a low contribution to adhesion particularly when a hardly adhesive resin such as a liquid crystal polymer is used as a material for the resin base material. Thus, in the image analysis, a position whose height from the lowest line $L_B$ is 25% of the overall measurement area height in the measurement area is set to a "standard height $L_S$" as an effective height which ensures that a contribution to adhesion can be secured.

Then, in the present disclosure, particles protruding to above the "standard height $L_S$" are defined as "roughening particles". In such roughening particles, the particle height of the roughening particle is defined as a dimension h in the height direction between the lowest line $L_B$ of the measurement area and the tip end of the roughening particle. Further, at a position which is higher than the standard height $L_S$ and at which the dimension is the largest in the width direction, a line is drawn, and the particle width of the roughening particle is defined as a dimension W in the width direction between two points at which the line intersects with the contour of the roughening particle.

In the meantime, it has been heretofore known that a method in which the particle height on a roughened surface is increased, and a method in which the ratio of the particle height to the particle width (particle height/particle width) is increased are effective for enhancing physical adhesion (anchoring effect) of a hardly adhesive resin such as a liquid crystal polymer.

Figure 5A:
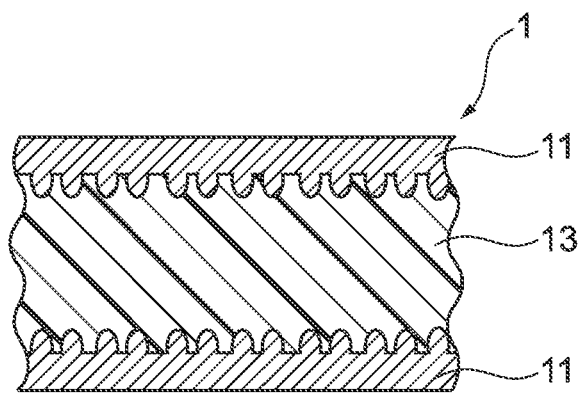
FIGS. 5A to 5D are diagrams for illustrating problems conventionally occurring in formation of a blind via hole in a copper-clad laminate sheet by laser irradiation.
Figure 5B:
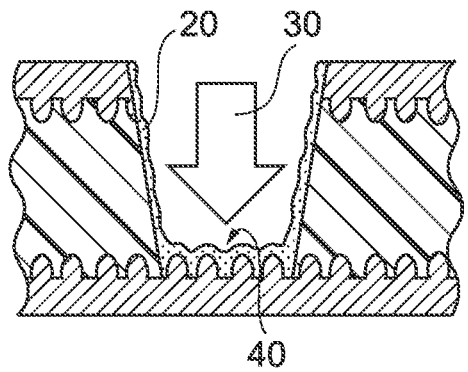

However, with further improvement of the high-frequency property in recent years, attempts have been made to reduce the particle height on a roughened surface. In this case, in a step of laser processing, a resin is easily retained on a surface of a roughening particle at the blind via hole bottom part 40 and in gaps between roughening particles (see FIG. 5B).

Figure 5C:
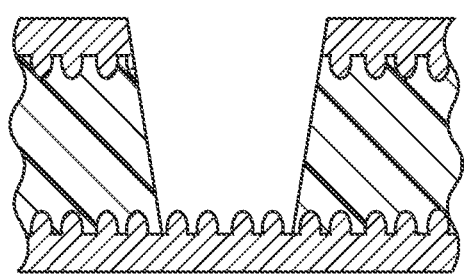
Figure 5D:
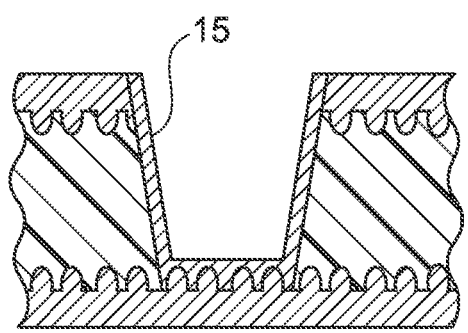

For example, when a resin base material containing an epoxy-based resin such as FR-4 (Flame Retardant Type 4) is used, resin residues after laser processing can be removed by desmear treatment (see FIG. 5C). However, when a hardly adhesive resin such as a liquid crystal polymer is used, a sufficient effect of desmear treatment cannot be obtained due to chemical stability of the resin, and thus resin residues cannot be sufficiently removed. As a result, connection reliability in interlayer connection is deteriorated.

Generation of the resin residues is particularly noticeable when transmission loss caused by the copper foil is reduced, that is, when roughening particles are micronized. In the present disclosure, by controlling the formation state of roughening particles on a roughened surface, a surface-treated copper foil having a reduced amount of resin residues after laser irradiation (having favorable laser processability) even when subjected to minute roughening treatment can be obtained.

Specifically, control is performed so that on a roughened surface, the standard deviation of the particle height of roughening particles is 0.16 μm or more and 0.30 μm or less, and the average value of the ratio of the particle height to the particle width (particle height/particle width) of roughening particles is 2.30 or more and 4.00 or less. Control performed so that the standard deviation of the particle height of roughening particles and the average value of the ratio of the particle height to the particle width (particle height/particle width) of roughening particles are within the above-described ranges means that on a roughened surface, the uniformity of the particle height of roughening particles is reduced to a certain degree, and roughening particles are made to have a long and narrow shape.

A mechanism in which favorable laser processability is obtained on a roughened surface controlled as described above is not necessarily evident, but on the roughened surface, regular reflection of laser light at the roughened surface during laser irradiation can be effectively suppressed to introduce the laser light into gaps between roughening particles. Further, after being introduced into the gaps between the roughening particles, the laser light may be easily introduced to the lower parts of the gaps while being irregularly reflected at lateral surfaces of the roughening particles. It is presumed that as a result, laser light applied to the roughened surface can be effectively utilized for removal of the resin, resulting in effective reduction of resin residues retained on the copper foil surface after laser irradiation. Specifically, the presumed mechanism is as follows.

Figure 2A:
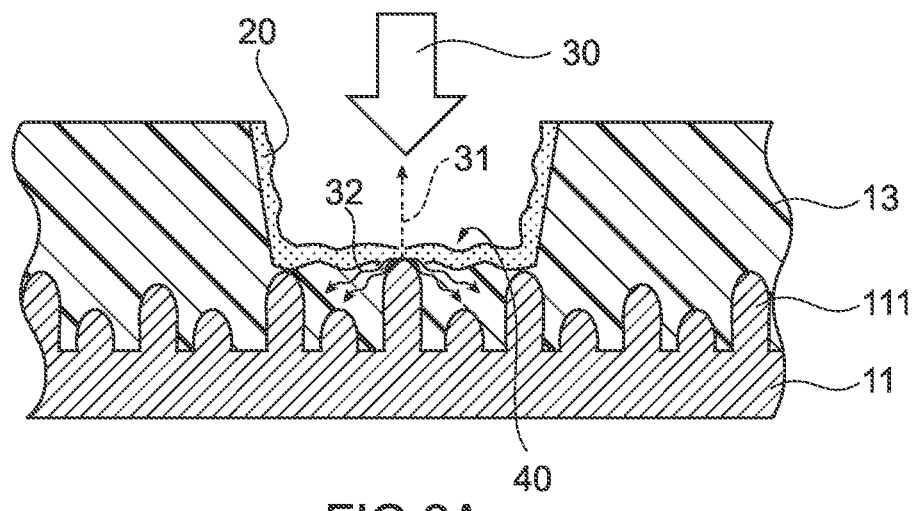
FIGS. 2A and 2B are diagrams for illustrating a state of a surface of the surface-treated copper foil in laser irradiation performed on a copper-clad laminate sheet using the surface-treated copper foil of the present disclosure.
Figure 2B:
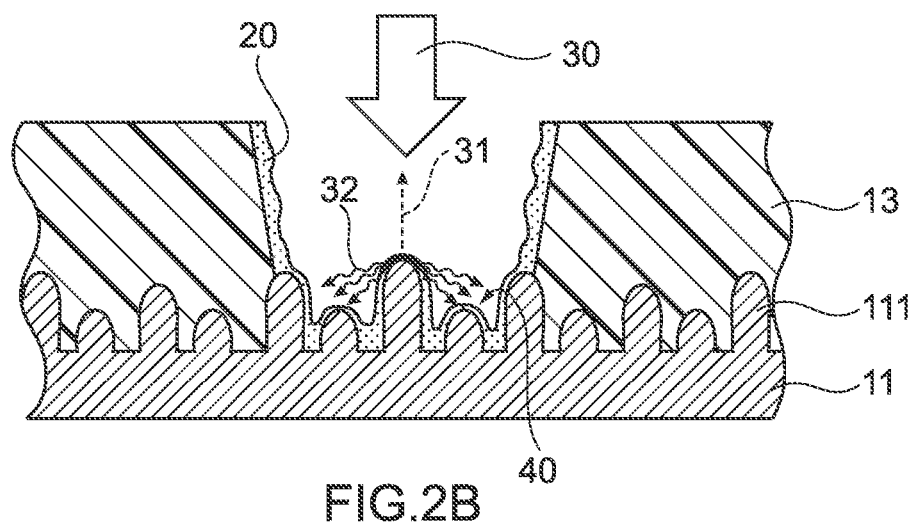
Figure 3A:
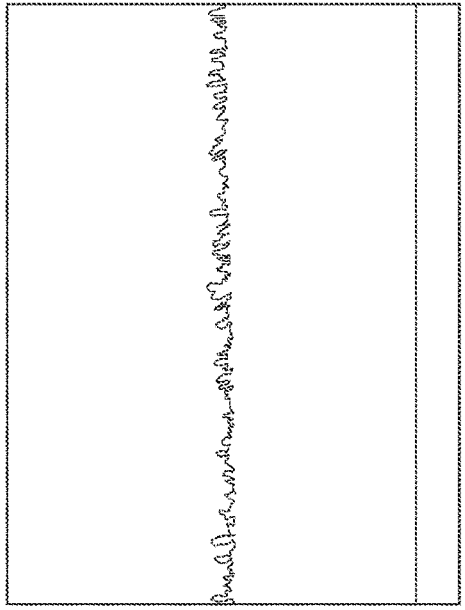
FIGS. 3A to 3D show a SEM image (FIG. 3A) in observation of a cross-section of a surface-treated copper foil prepared in Example 5, and pictures (FIGS. 3B to 3D) obtained by processing the SEM image under predetermined conditions.
Figure 3B:
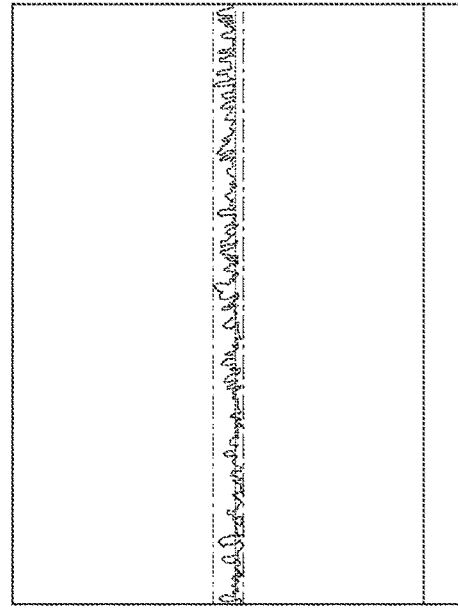
Figure 3C:
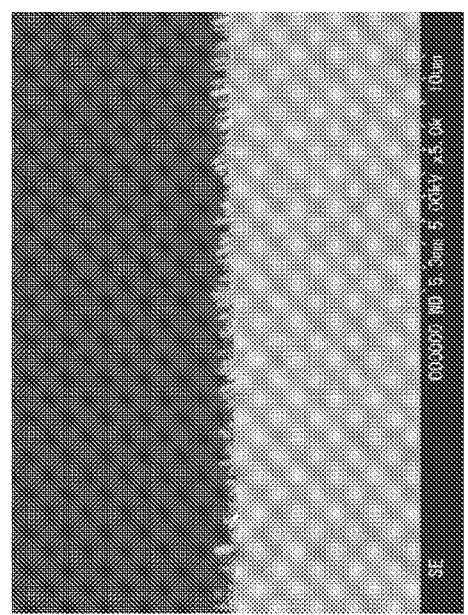
Figure 3D:
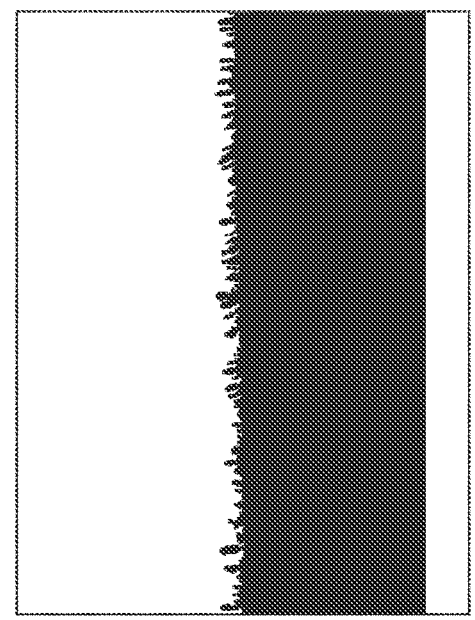
Figure 4A:
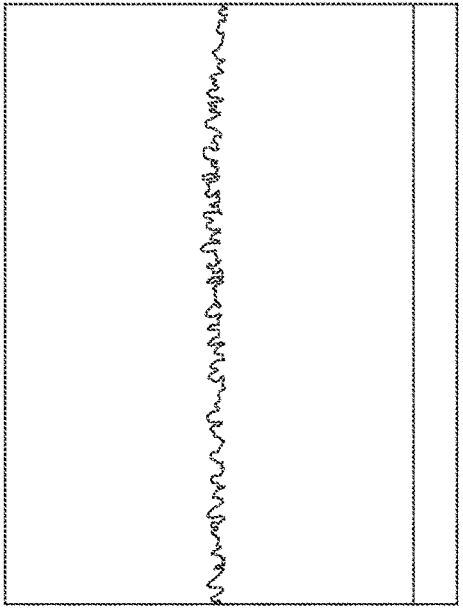
FIGS. 4A to 4D show a SEM image (FIG. 4A) in observation of a cross-section of a surface-treated copper foil prepared in Comparative Example 7, and pictures (FIGS. 4B to 4D) obtained by processing the SEM image under predetermined conditions.
Figure 4B:
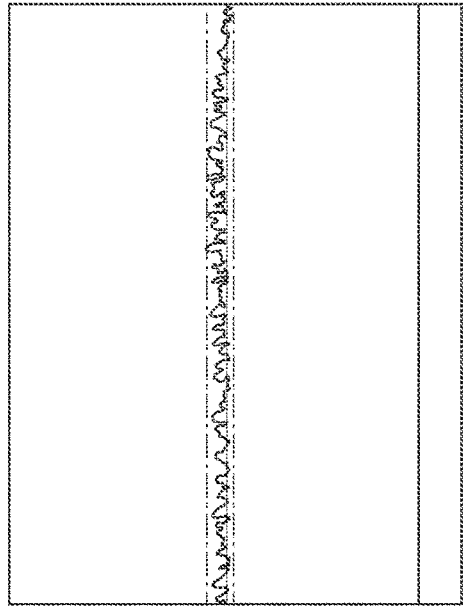
Figure 4C:
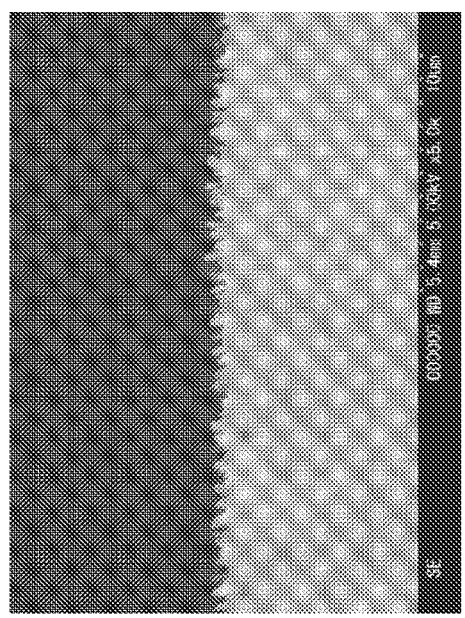
Figure 4D:
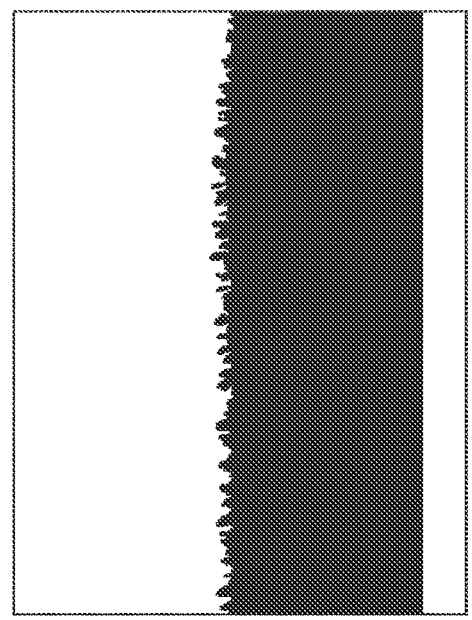
Figure 6A:
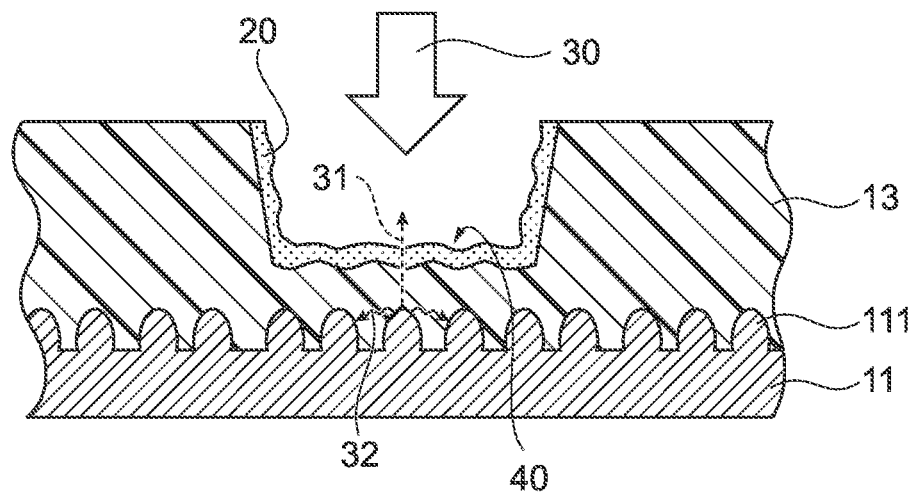
FIGS. 6A and 6B are diagrams for illustrating a state of a surface of a surface-treated copper foil in laser irradiation performed on a copper-clad laminate sheet using a conventional surface-treated copper foil.
Figure 6B:
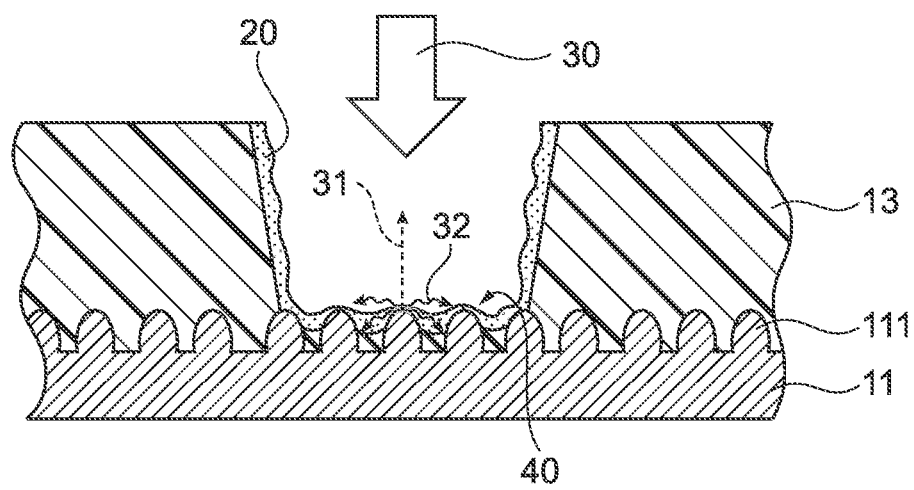

FIGS. 2A and 2B schematically show a state of a surface of the surface-treated copper foil in laser irradiation performed on a surface of a resin base material of a copper-clad laminate sheet using the surface-treated copper foil of the present disclosure. Further, for comparison with the present disclosure, FIGS. 6A and 6B schematically show a state of a surface of the surface-treated copper foil in laser irradiation performed on a surface of a resin base material of a copper-clad laminate sheet using a conventional surface-treated copper foil. At the time of starting irradiation of laser light 30, regular reflection of laser light 30 at the surface of the resin base material easily occurs (not shown) because the surface of the resin base material 13 is smooth. However, when the roughened surface of the surface-treated copper foil 11 starts being exposed as removal of the resin base material 13 progresses at a laser irradiation part, irregular reflection 32 (wavy line arrow) of laser light 30 occurs at the tip end and the lateral surface of a roughening particle 111, so that the degree of removal of the resin base material 13 by laser light 30 is enhanced (FIGS. 2A and 2B and FIGS. 6A and 6B). It is presumed that the action of removing a resin by irregular reflection 32 of laser light is more noticeable, leading to improvement of laser processability when the height of the roughening particle 111 is uneven as shown in FIG. 2B. In FIGS. 2A and 2B and FIGS. 6A and 6B, a broken line arrow 31 indicates a regular reflection of laser light, and a wavy line arrow 32 indicates irregular reflection of laser light.

On the roughened surface, the standard deviation of the particle height of roughening particles is 0.16 µm or more and 0.30 µm or less, preferably 0.22 µm or more and 0.30 µm or less. By performing control so that the standard deviation of the particle height is within the above-described range, regular reflection of laser light at the surfaces of roughening particles is effectively suppressed during laser irradiation, and laser light entering gaps between roughening particles is easily introduced to the lower parts of the gaps while being irregularly reflected at the tip ends and the lateral surfaces of the roughening particles. As a result, an effect of reducing the amount of resin residues retained on the copper foil surface after laser irradiation is obtained. When the standard deviation of the particle height is less than 0.16 µm, the effect of suppressing regular reflection of laser light is reduced, so that laser processability is deteriorated, and adhesion between the copper foil and the resin base material is deteriorated. On the other hand, when the standard deviation of the particle height is more than 0.30 µm, transmission loss may increase, leading to deterioration of the high-frequency property.

On the roughened surface, the average value of the particle height of roughening particles is preferably 0.50 µm or more and 1.20 µm or less, more preferably 0.60 µm or more and 0.90 µm or less. By performing control so that the average value of the particle height is within the above-described range, adhesion with the resin base material can be further improved while transmission loss is reduced. When the average value of the particle height is less than 0.50 µm, the effect of suppressing regular reflection of laser light is reduced, so that laser processability is deteriorated, and adhesion between the copper foil and the resin base material is deteriorated. On the other hand, when the average value of the particle height is more than 1.20 µm, transmission loss may increase, leading to deterioration of the high-frequency property.

On the roughened surface, the average value of the ratio of the particle height to the particle width (particle height/particle width) of roughening particles is 2.30 or more and 4.00 or less, preferably 2.60 or more and 3.80 or less. By performing control so that the average value of the ratio is within the above-described range, regular reflection of laser light at the roughening particle surfaces is effectively suppressed during laser irradiation, and laser light entering gaps between roughening particles is easily introduced to the lower parts of the gaps while being irregularly reflected at the lateral surfaces of the roughening particles. As a result, an effect of reducing the amount of resin residues retained on the copper foil surface after laser irradiation is obtained. When the average value of the ratio (particle height/particle width) is less than 2.30, the effect of suppressing regular reflection of laser light is reduced, so that laser processability is deteriorated, and adhesion between the copper foil and the resin base material is deteriorated. On the other hand, when the average value of the ratio (particle height/particle width) is more than 4.00, the resin base material may be difficult to pack in gaps between roughening particles, leading to deterioration of adhesion between the copper foil and the resin base material.

Further, on the roughened surface, the standard deviation of the particle height ratio to the particle width (particle height/particle width) of roughening particles is preferably 1.20 or more and 2.00 or less. By performing control so that the standard deviation of the ratio is within the above-described range, adhesion with the resin base material can be improved while the roughened surface is minutely roughened. When the standard deviation of the ratio (particle height/particle width) is less than 1.20, the effect of suppressing regular reflection of laser light is reduced, so that laser processability is deteriorated, and adhesion between the copper foil and the resin base material is deteriorated. On the other hand, the standard deviation of the ratio (particle height/particle width) is more than 2.00, the resin base material packed in gaps between roughening particles may be easily removed, leading to deterioration of adhesion between the copper foil and the resin base material.

On the roughened surface, the luminance (brightness value) is preferably 10.0 or more and 14.0 or less. In general, as the luminance of the roughened surface decreases, laser processability tends to be further improved because regular reflection of laser light at the roughened surface can be more effectively suppressed. On the other hand, the luminance of the roughened surface is excessively low, reflection performance of laser light itself at the roughened surface is reduced. It is preferable to perform control so that the luminance is within the above-described range for stably achieving favorable laser processability. In this specification, the luminance means a "Y value" indicating a reflectance in the XYZ color system specified by CIE (International Commission on Illumination).

By using the surface-treated copper foil of the present disclosure, for example, for a conductor circuit of a circuit board, transmission loss in transmission of a high-frequency signal in a GHz band can be suppressed to a high degree, and adhesion between the surface-treated copper foil and the resin base material (resin layer) can be favorably maintained. Further, the amount of resin residues can be reduced during laser irradiation in formation of blind via holes, and therefore it is possible to obtain a circuit board having high interlayer connection reliability.

Next, an example of a preferred method for producing a surface-treated copper foil according to the present disclosure will be described. In the method for producing a surface-treated copper foil, it is preferable to perform roughening treatment in which roughening particles are formed on a surface of a copper foil substrate.

For the copper foil substrate, a known material, for example an electrolytic copper foil or a rolled copper foil can be used. For performing control so that the uniformity of roughening particles as described later is within a predetermined range, it is preferable that the surface of the copper foil substrate before performing roughening treatment should not be excessively rough, and for example, the surface roughness of the copper foil substrate surface is preferably 1.5 µm or less in terms of a ten-point average roughness Rzjis conforming to JIS B0601-2001. Even when the surface of the copper foil substrate is smooth, it is difficult to perform control so that the degree of uniformity of roughening particles is within a predetermined range in the case of, for example, a rolled copper foil having a recessed part such as an oil pit. Thus, the copper foil substrate is preferably an electrolytic copper foil in particular.

It is preferable that roughening treatment be performed by, for example, combination of plating treatment for roughening (1) and plating treatment for roughening (2) as shown below.

The plating treatment for roughening (1) is a method in which roughening particles are formed on at least one surface of a copper foil substrate, specifically plating treatment is performed in a copper sulfate bath under the following conditions.

The plating treatment for roughening (2) is performed for preventing fall of roughening particles (fixing roughening particles) by applying smooth cover plating over the copper foil substrate surface-treated in the plating treatment for roughening (1). Specifically, plating treatment is performed in a copper sulfate bath under the following conditions.

Examples of the compositions of plating solutions and electrolysis conditions for plating treatments for roughening (1) and (2) are shown below. The conditions shown below are preferred examples, and the types and amounts of additives, and electrolysis conditions may be appropriately changed and adjusted as necessary as long as the effects of the present disclosure are not hindered.

<Conditions for Plating Treatment for Roughening (1)>
Copper sulfate pentahydrate: 50 to 100 g/L in terms of copper (atom)
Sulfuric acid: 100 to 200 g/L
Ammonium molybdate: 0.01 to 0.04 g/L in terms of molybdenum (atom)
Iron sulfate (II) heptahydrate: 1 to 10 g/L in terms of iron (atom)
Current density: 10 to 25 A/dm$^2$
Liquid temperature (bath temperature): 20 to 25° C.

<Conditions for Plating Treatment for Roughening (2)>
Copper sulfate pentahydrate: 40 to 60 g/L in terms of copper (atom)
Sulfuric acid: 80 to 120 g/L
Current density: 0.5 to 10 A/dm$^2$
Liquid temperature (bath temperature): 45 to 60° C.

In the meantime, in conventional production of a surface-treated copper foil which exhibits a favorable high-frequency property, it is the general practice to micronize roughening particles for reducing transmission loss. However, the micronization of roughening particles tends to deteriorate adhesion with the resin base material and laser processability.

For reducing transmission loss, and improving adhesion with the resin base material and laser processability, control is performed so that on the roughened surface, the particle height of roughening particles is moderately uneven, and the particle shape is a long and narrow shape. This makes it possible to obtain a surface-treated copper foil of the present disclosure in which all of demand properties that are high-frequency property, adhesion and laser processability are favorable.

Usually, the uniformity of the particle height tends to be enhanced as the sizes of roughening particles are decreased. This may be because nucleation easily occurs during electroplating in roughening treatment. It is considered that in this situation, nucleus growth of roughening particles by electroplating easily stops, growth of specific roughening particles on a preferential basis hardly occurs, and accordingly, differences in height hardly arise among individual roughening particles.

Thus, it is desirable to employ plating conditions in which during electroplating in roughening treatment, nucleation is suppressed, and nucleus growth occurs on a preferential basis. Examples of conditions effective for suppressing nucleation during electroplating in roughening treatment include setting the current density in plating to a low value, increasing the surface roughness of the copper foil substrate, increasing the number of directions in which a plating solution is discharged, setting the liquid temperature of the plating solution to a low value, and decreasing the conveyance speed of the copper foil substrate.

The conditions for discharging the plating solution, and the conveyance speed of the copper foil substrate exert influences on the flow of the plating solution to the copper foil substrate surface, and affect how the plating solution flows on the copper foil substrate surface. A state in which the plating solution orderly flows is apt to produce a laminar flow, and a state in which the flow of the plating solution is disordered is apt to produce a turbulent flow. It is presumed that under the state of a laminar flow, the plating is apt to uniformly grow, so that the roughening particles have a uniform shape, and under the state of a turbulent flow, growth of the plating is uneven, so that the roughening particles have an uneven shape. By discharging the plating solution in a plurality of directions, or decreasing the conveyance speed of the copper foil substrate, the flow of the plating solution is easily made turbulent. By adjusting the plating conditions in this way, an effect of suppressing nucleation during plating can be obtained.

Further, when the surface of the copper foil substrate has minute surface irregularities that do not impair macroscopic smoothness, a distribution is generated in a current during electroplating in roughening treatment. The current is easily concentrated on a protruding part, so that roughening particles are high-grown at the protruding part, and on the other hand, the current hardly passes into a recessed part, so that roughening particles are low-grown at the recessed part. Consequently, roughening particles with a high roughening level and roughening particles with a low roughening level coexist. Thus, the plating conditions for suppressing nucleation during electroplating in roughening treatment are applied to the copper foil substrate having surface irregularities that do not impair macroscopic smoothness, whereby the uniformity of the height of the roughening particles can be reduced without significantly adjusting plating conditions.

Examples of methods for forming minute surface irregularities that do not impair the macroscopic smoothness of the copper foil substrate include a method in which the roughness of a drum surface in preparation of a copper foil substrate is adjusted (for example, the drum surface is polished with a rough buff), a method in which the concentrations and the ratio of a brightener and a leveler added to a plating solution during preparation of the foil are adjusted (for example, the concentration of the leveler is decreased), and a method in which the surface of the copper foil after preparation of the foil is chemically dissolved (etched) (for example, the etching time is increased).

As the surface roughness of the copper foil substrate before performing roughening treatment increases, it becomes easier to produce a level difference in the roughening level of roughening particles. On the other hand, when the surface roughness is excessively increased, the roughening level of roughening particles becomes high as a whole, so that it is difficult to perform control so that the uniformity of the height of roughening particles is within a predetermined range. As a result, the high-frequency property may be adversely affected. Thus, the surface roughness of the copper foil substrate before performing roughening treatment is preferably 1.5 μm or less in terms of a ten-point average roughness Rzjis conforming to JIS B0601-2001.

In addition, by appropriately combining roughening treatment methods, the uniformity of the height of roughening particles can be moderately reduced without excessively increasing the surface roughness of the copper foil substrate. As an example, by performing electroplating of roughening particles in a plurality of batches in such a manner that the current density is greater in the later electroplating than in the earlier electroplating, the level difference in roughening particles formed by the earlier electroplating can be further expanded. Further, as another example, by appropriately selecting elements to be added, in a plating solution for plating for roughening in a plurality of batches of electroplating, the level difference in roughening particles can be expanded.

In particular, a plurality of plating conditions are controlled so as to suppress nucleation during electroplating in roughening treatment. Consequently, some roughening particles are grown to a long and narrow shape, and the height of roughening particles is made uneven to moderately reduce the uniformity of the height of roughening particles as a whole. As a result, it is possible to obtain a surface-treated copper foil in which all of demand properties that are high-frequency property, adhesion and laser processability are favorable. Further, it is preferable to appropriately select an optimum combination of the roughening treatment conditions in consideration of productivity and the like.

Further, the surface-treated copper foil of the present disclosure may have on at least one surface of the copper foil substrate a roughening-treated surface with a predetermined minute-irregular surface shape which is formed by electrodeposition of roughening particles, and further, a silane coupling agent layer may be formed on the roughening-treated surface directly, or indirectly where intermediate layers such as an underlying layer containing Ni, a thermally stabilizing layer containing zinc (Zn) and a rust-proofing layer containing chromium (Cr) are interposed between the silane coupling agent layer and the roughened surface. The underlying layer, the intermediate layers and the silane coupling agent layer have a very thin treatment thickness, and therefore do not affect the particle shape of roughening particles on the roughened surface of the surface-treated copper foil. The particle shape of roughening particles on the roughened surface of the surface-treated copper foil is substantially determined by the particle shape of roughening particles on a roughening-treated surface corresponding to the roughened surface.

Further, examples of methods for forming a silane coupling agent layer include a method in which a silane coupling agent solution is applied onto the irregular surface of the roughening-treated surface of the surface-treated copper foil directly, or indirectly with an underlying layer, intermediate layers and the like interposed between the irregular surface and the silane coupling agent solution, and then air-dried (naturally dried) or dried by heating to form the silane coupling agent layer. Drying of the applied silane coupling agent solution may be performed so as evaporate water, but it is preferable to dry the silane coupling agent solution by heating at 50 to 180° C. because reaction of the silane coupling agent with the copper foil is accelerated.

The concentration of a silane coupling agent in the solution which is used in application of the silane coupling agent solution to the surfaces of the underlying layer, the intermediate layers and the like is preferably 0.01 to 15% by volume, more preferably 0.1 to 10% by volume for achieving high adhesion by applying a sufficient amount of the silane coupling agent. It is preferable to use water as a solvent of the solution.

It is preferable that the silane coupling agent layer contain one or more of silane coupling agents which are epoxy-based silane, amino-based silane, vinyl-based silane, methacryl-based silane, acryl-based silane, styryl-based silane, ureido-based silane, mercapto-based silane, sulfide-based silane and isocyanate-based silane. These silane coupling agents vary in effect depending on interaction with reactive functional groups contained in the resin of the resin base material, and therefore it is necessary to select suitable silane coupling agents in consideration of compatibility with the resin.

Specific examples of the silane coupling agents include 3-aminopropyltrimethoxysilane, 3-aminopropyltriethoxysilane, vinyltrimethoxysilane, vinyltriethoxysilane, 3-methacryloxypropyltrimethoxysilane, 3-methacryloxypropyltriethoxysilane, p-styryltrimethoxysilane, p-styryltriethoxysilane, 3-glycidoxypropyltrimethoxysilane, 3-acryloxypropyltrimethoxysilane, 3-ureidopropyltriethoxysilane, 3-mercaptopropyltrimethoxysilane, 3-isocyanatopropyltriethoxysilane and bis(3-(ethoxysilyl)propyl)disulfide, but even silane coupling agents other than those listed above can be appropriately selected and used. Further, one of these silane coupling agents may be used singly, or two or more of these silane coupling agents may be used in combination.

It is preferable that at least one intermediate layer selected from an underlying layer containing Ni, a thermally stabilizing layer containing Zn, and a rust-proofing layer containing Cr be present between the surface-treated copper foil and the silane coupling agent layer as another embodiment.

For example, it is preferable that the underlying layer containing Ni be formed between the roughening-treated surface and the silane coupling agent layer when copper (Cu) in the copper foil substrate or the roughening-treated surface may be diffused into the resin base material, leading to deterioration of adhesion due to copper damage. It is preferable that the underlying layer be formed of, for example, Ni, or an alloy containing Ni and at least one element other than Ni, the alloy being selected from, for example, Ni-phosphorus (P) and Ni—Zn.

It is preferable that the thermally stabilizing layer containing Zn be formed when it is necessary to further enhance heat resistance. It is preferable that the thermally stabilizing layer be formed of, for example, Zn, or an alloy containing Zn and at least one element other than Zn, the alloy being selected from Zn-tin (Sn), Zn—Ni, Zn-cobalt (Co), Zn—Cu, Zn—Cr, Zn-vanadium (V) and the like.

It is preferable that the rust-proofing layer containing Cr be formed when it is necessary to further enhance corrosion resistance. It is preferable that the rust-proofing layer be formed of, for example, Cr, or an alloy containing Cr and at least one element other than Cr, the alloy being selected from Cr—Zn, a chromate layer formed by chromate treatment, and the like.

When all of the three layers which are the underlying layer, the thermally stabilizing layer and the rust-proofing layer are formed, it is preferable to form these layers in the order presented on the roughening-treated layer, and one or two of these layers may be formed according to a use purpose or desired properties.

[Preparation of Surface-Treated Copper Foil]

An example of a preferred method for producing a surface-treated copper foil according to the present disclosure will be summarized below. Preferably, a surface-treated copper foil is prepared in accordance with the following steps (S1) to (S5).

(S1) Step of Forming Roughening-Treated Layer

A roughening-treated surface having minute irregularities is formed on a copper foil substrate by electroplating of roughening particles.

(S2) Step of Forming Underlying Layer

An underlying layer containing Ni is formed on the roughening-treated surface as necessary.

(S3) Step of Forming Thermally Stabilizing Layer

A thermally stabilizing layer containing Zn is formed on the roughening-treated surface or the underlying layer as necessary.

(S4) Step of Forming Rust-Proofing Layer

A rust-proofing layer containing Cr is formed as necessary on the roughening-treated surface, or the underlying layer and/or the thermally stabilizing layer formed on the roughening-treated surface as necessary.

(S5) Step of Forming Silane Coupling Agent Layer

A silane coupling agent layer is formed on the roughening-treated surface directly, or indirectly where at least one of the underlying layer, the thermally stabilizing layer and the rust-proofing layer as intermediate layers is interposed between the roughening-treated surface and the silane coupling agent layer.

The surface-treated copper foil of the present disclosure is suitably used for production of a copper-clad laminate sheet. Such a copper-clad laminate sheet is suitably used for production of a printed wiring board having high adhesion and a favorable high-frequency property. That is, the surface-treated copper foil of the present disclosure can be suitably used for a printed wiring board for a high-frequency band.

It is preferable that the copper-clad laminate sheet of the present disclosure be formed using the above-described surface-treated copper foil of the present disclosure. Such a copper-clad laminate sheet of the present disclosure can be formed by a known method. For example, the copper-clad laminate sheet can be produced by laminating and bonding the surface-treated copper foil of the present disclosure to a resin base material in such a manner that the surface-treated copper foil faces the resin base material at a roughened surface (bonding surface) of the surface-treated copper foil.

Further, when the copper-clad laminate sheet is produced, a surface-treated copper foil having a silane coupling agent layer and a resin base material may be hot-pressed to tightly contact each other. A copper-clad laminate sheet prepared by applying a silane coupling agent onto a resin base material, and hot-pressing the resin base material and a surface-treated copper foil with a rust-proofing layer on an outermost surface of the surface-treated copper foil so that the resin base material and the surface-treated copper foil tightly contact each other has an effect equivalent to that of the copper-clad laminate sheet of the present disclosure.

Here, as resins to be used for the resin base material, polymer resins of various components can be used. Phenol resins or epoxy resins can be mainly used for rigid wiring boards or printed wiring boards for semiconductor packages (PKGs). Polyimides or polyamidimides can be mainly used for flexible boards. For fine pattern (high density) wiring boards or high-frequency boards, heat-resistant resins having a high glass transition point (Tg) can be used as materials having favorable dimensional stability, materials which are hardly warped and twisted, materials which are hardly thermally shrunk, and the like. Examples of the heat-resistant resins include thermoplastic resins such as liquid crystal polymers, polyether ether ketone, polyphenylene sulfide, polyphenylene ether, polyphenylene oxide, polyether imide, polyether sulfone, polyethylene naphthalate, polyethylene terephthalate and thermoplastic polyimides or polymer alloys of these resins, and thermosetting resins such as polyimides, heat-resistant epoxy resins, cyanate-based resins such as bismaleimide t iazine and thermosetting modified polyphenylene ether. In particular, the resin to be used for the resin base material of the copper-clad laminate sheet of the present disclosure is preferably a liquid crystal polymer.

Hereinafter, a specific example of a method for producing a copper-clad laminate sheet using, for example, a liquid crystal polymer film as a resin base material will be described.

Liquid crystal polymers include thermotropic liquid crystal polymers which exhibits a liquid crystalline property in a molten state, and rheotropic liquid crystal polymers which exhibits a liquid crystalline property in a solution state. In the present embodiment, any of these liquid crystal polymers can be used, thermotropic liquid crystal polymers are preferably used because thermotropic liquid crystal polymers are thermoplastic, and more excellent in dielectric properties.

Among thermotropic liquid crystal polymers, thermoplastic liquid crystal polyester (hereinafter referred to simply as "liquid crystal polyester") is aromatic polyester obtained by, for example, reacting aromatic hydroxycarboxylic acid as an essential monomer with a monomer such as aromatic dicarboxylic acid or aromatic diol, and exhibits a liquid crystalline property in a molten state. Typical examples of the liquid crystal polyester include type I liquid crystal polyester [formula (1) below] synthesized from parahydroxybenzoic acid (PHB), phthalic acid and 4,4'-biphenol, type II liquid crystal polyester [formula (2) below] synthesized from PHB and 2,6-hydroxynaphthoic acid, and type III liquid crystal polyester [formula (3) below] synthesized from PHB, terephthalic acid and ethylene glycol.

[Formula 1]

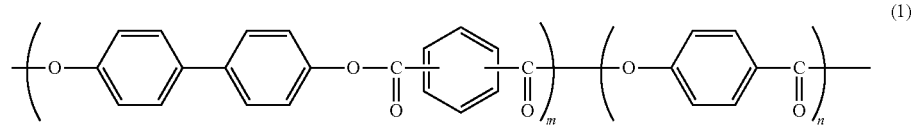

(1)

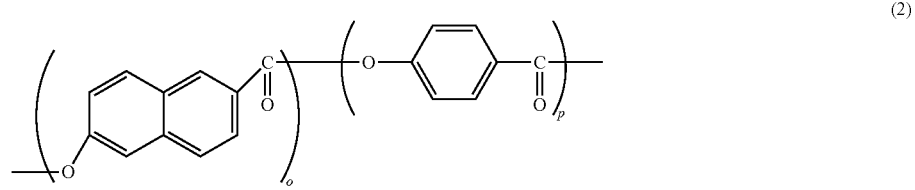

(2)

-continued

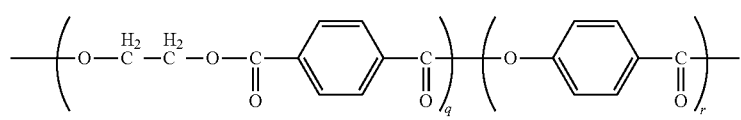

(3)

In the present embodiment, among the liquid crystal polyesters described above, type I liquid crystal polyester and type II liquid crystal polyester are preferable because these liquid crystal polyesters are excellent in heat resistance and hydrolysis resistance. Further, in the formula (1), phthalic acid is preferably isophthalic acid.

It is preferable that the liquid crystal polymer film for use in the present embodiment include substantially only a liquid crystal polymer from the viewpoint of dielectric properties. On the other hand, a liquid crystal polymer exhibits strong anisotropy when shearing stress is applied, and therefore a filler for relaxing anisotropy of molecular orientation occurring in melt-processing of the liquid crystal polymer may be blended as necessary. When such a filler for relaxation of orientation is introduced, for example, the liquid crystal polymer has a smooth surface after being extruded, and a uniform orientation property and isotropy are easily obtained. In addition, a coloring filler may be blended for controlling the color tone of the liquid crystal polymer film.

The filler for relaxation of orientation or the filler for coloring, which may be blended in the liquid crystal polymer film, is not particularly limited, and examples of the filler include fillers composed of talk, mica, aluminum oxide, titanium oxide, silicon oxide, silicon nitride and carbon black. The shape of the filler is not particularly limited, examples of the shape include a spherical shape, a plate shape, a rod shape, a needle shape and a formless shape, and the size of the filler is preferably 50 nm or more and 10 μm or less. The size of the filler may be determined by measuring the longest part of each filler in an enlarged photograph of the filler, or may be calculated as a volume average particle diameter or a number average particle diameter determined from particle size distribution measurement.

The filler for relaxation of orientation or the filler for coloring for the liquid crystal polymer film may impair the dielectric properties of the base material film. Thus, the ratio of the filler to the entire liquid crystal polymer film (total of liquid crystal polymer and filler) is preferably 20% by mass or less. When the above-described ratio is 20% by mass or less, it is possible to impart excellent dielectric properties as those of a liquid crystal polymer film.

The linear thermal expansion coefficient of such a liquid crystal polymer film in a planar direction is preferably 3 ppm/° C. or more and 30 ppm/° C. or less. When there is a large difference between the linear thermal expansion coefficient of the liquid crystal polymer film and the linear thermal expansion coefficient of the surface-treated copper foil, warpage tends to occur in the copper-dad laminate sheet. Thus, by making the linear thermal expansion coefficients of the liquid crystal polymer film and the surface-treated copper foil roughly equal to each other, occurrence of warpage can be suppressed.

It is known that in general, molecules of liquid crystal polymers are rigid, have a long chemical structure, and are therefore extremely easily oriented. An anisotropic film in which liquid crystal polymer molecules are oriented in a specific direction easily tears in an orientation direction, is difficult to handle, and has poor dimensional accuracy, and the thermal stress, the mechanical strength and the relative permittivity of the anisotropic film widely vary. Further, when a surface-treated copper foil is laminated to an anisotropic film to produce a copper-clad laminate sheet, warpage resulting from the anisotropy of the film occurs in the copper-clad laminate sheet, and therefore the anisotropic film cannot be used as an insulating base material for an electronic circuit board.

Therefore, it is preferable that the r molecular orientation of a liquid crystal polymer film to be used as an insulating base material for an electronic circuit board be controlled so that the film has isotropy. Specifically, the ratio of the maximum value to the minimum value of the linear thermal expansion coefficient in a planar direction is preferably 1.0 or more and 2.5 or less. The ratio is more preferably 2.0 or less, further preferably 1.8 or less, especially preferably 1.5 or less. The linear thermal expansion coefficient is measured at six points at intervals of 30° in a circumferential direction on a plane of the liquid crystal polymer film, and the minimum value and the maximum value among the measured values are defined, respectively, as the minimum value and the maximum value of the linear thermal expansion coefficient.

When the linear thermal expansion coefficient, and the ratio of the maximum value to the minimum value of the linear thermal coefficient in a planer direction are adjusted within the above-described ranges, anisotropy in thermal stress, mechanical strength and relative permittivity in the planar direction can be more reliably reduced. Further, occurrence of warpage in the copper-clad laminate sheet can be more reliably suppressed, and excellent properties as those of a material for an electronic circuit board, such as excellent dimensional stability, can be imparted. For example, the warpage ratio of a copper-clad laminate sheet having a surface-treated copper foil laminated on one surface of a liquid crystal polymer film can be reduced to 10% or less. The "warpage ratio" can be determined in conformity with JIS C6481-1996. Specifically, the film is placed on a horizontal table in such a manner as to contact the table at the center of the film and float in the air above the table at the four corners of the film, distances between the four corners and the table are measured, the maximum value of the distances is determined, and divided by the length of a side of the film, and the value thus obtained is expressed as a percentage, and defined as a "warpage ratio".

Liquid crystal polymer films generally have excellent dielectric properties. Specifically, when measurement is performed at a frequency of 3 GHz, the dielectric loss tangent is preferably 0.0035 or less, more preferably 0.003 or less, and it is further preferable that the relative permittivity be 3.5 or less. At the time when an alternating current electric signal is propagated to a circuit formed on an insulating base material which is a dielectric material, electric power for the signal tends to be partially absorbed by the dielectric material, resulting in attenuation/loss of the signal. The ratio of absorbed electric power to passing (propagated) electric power at this time is the dielectric loss tangent, and in a circuit using a dielectric material having a small dielectric loss tangent, transmission loss can be decreased.

The thickness of the liquid crystal polymer film may be appropriately adjusted, and is preferably 10 μm or more and 75 μm or less. When the thickness is 10 μm or more, it is possible to secure sufficient strength and insulation quality as those of an insulating film for an electronic circuit board. On the other hand, when the thickness is 75 μm or less, the film is not bulky, and thus can meet downsizing of electronic devices. The lower limit value of the thickness is more preferably 13 μm or more, further preferably 20 μm or more, and the upper limit value of the thickness is more preferably 50 μm or less, further preferably 25 μm or less. By reducing the thickness of the film, flexibility is enhanced, and a multilayer electronic circuit board can be downsized, so that it is possible to use a high-frequency circuit board in a small electronic device.

Since the liquid crystal polymer is thermoplastic, the copper-clad laminate sheet according to the present embodiment can be easily prepared by laminating a surface-treated copper foil to one surface or both surfaces of the liquid crystal polymer film, and then performing hot pressing. The hot pressing can be performed by a previously known method using a vacuum pressing apparatus, a roll pressing apparatus, a double belt pressing apparatus or the like. Conditions for hot pressing may be appropriately adjusted, and for example, in the case of vacuum pressing, the hot pressing may be performed at a temperature of about 200° C. or higher and 350° C. or lower and a pressure of about 1 MPa or more and 10 MPa or less for about 1 minute or more and 2 hours or less.

The thickness of the surface-treated copper foil according to the present embodiment may be appropriately adjusted, and may be, for example, about 2 μm or more and 70 μm or less, and the thickness is more preferably about 5 μm or more and 35 μm or less.

It is preferable that the copper-clad laminate sheet according to the present embodiment have particularly high adhesion between the surface-treated copper foil and the liquid crystal polymer film. The copper-clad laminate sheet having high adhesion can be used without problems such as peeling of the surface-treated copper foil and the resin base material from each other even after processing such as etching, boring, desmear, soft etching or copper plating in a step of forming a wiring pattern and a step of providing a blind via hole. As a standard for adhesion, specifically, the peel strength expressed as a strength (unit: N/mm) when in conformity with JIS C6471-1995, the surface-treated copper foil is etched to form a copper foil pattern of 5 mm×150 mm, and the copper foil pattern is peeled off in a direction of 180° at a speed of 50 mm/min using a tensile tester is preferably 0.40 N/mm or more, more preferably 0.60 N/mm or more, further preferably 0.70 N/mm or more.

It is preferable that the printed wiring board of the present disclosure be formed using the copper-clad laminate sheet. Such a printed wiring sheet of the present disclosure can be formed by a known method.

Further, by chemically etching part of the surface-treated copper foil of the copper-clad laminate sheet by a conventional method, a desired circuit pattern can be formed to prepare an electronic circuit board. Further, of course, an electronic circuit component can be mounted on the circuit pattern. The electronic circuit component is not particularly limited as long as the electronic circuit component is mounted on the electronic circuit board, and examples of the electronic circuit component include chip resistors, chip capacitors and semiconductor packages (PKGs) in addition to single semiconductor elements.

While the embodiment of the present disclosure has been described above, the embodiment is merely an example of the present disclosure. The present disclosure includes any aspects within the concept and claims of the present disclosure, and various modifications can be made within the scope of the present disclosure.

EXAMPLES

The present disclosure will be described in further detail below by way of examples, but the following is an example of the present disclosure.

Examples 1 to 10 and Comparative Examples 1 to 7

In Example 1, the following steps [1] to [4] were carried out to obtain a surface-treated copper foil. It will be described in detail hereinbelow. In Examples 2 to 10 and Comparative Examples 1 to 7, surface-treated copper foils were obtained by a method similar to that in Example 1 except that in the step [2] of forming a roughening-treated surface, conditions for plating treatment for roughening (1) were set as described in Table 1 below

[1] Preparation of Copper Foil Substrate

As a copper foil substrate as a base material to be subjected to roughening treatment, an electrolytic copper foil was prepared. The electrolytic copper foil was produced under the conditions described below. Further, the thickness and the surface roughness of the electrolytic copper foil produced under the conditions described below are as follows.

<Conditions for Production of Electrolytic Copper Foil>
Cu: 80 g/L
$H_2SO_4$: 70 g/L
Chlorine concentration: 25 mg/L
Bath temperature: 55° C.
Current density: 45 A/dm$^2$
(Additives)
Sodium 3-mercapto-1-propanesulfonate: 2 mg/L
Hydroxyethyl cellulose: 10 mg/L
Low-molecular-weight glue (molecular weight: 3000): 50 mg/L
<Electrolytic Copper Foil>
Thickness: 12 μm
Surface roughness: 1.3 μm (ten-point average roughness Rzjis conforming to JIS B0601-2001)

Measurement of the surface roughness was performed using a contact-type surface roughness measuring instrument ("Surfcorder SE1700" manufactured by Kosaka Laboratory Ltd.) on a surface of the electrolytic copper foil.

[2] Formation of Roughening-Treated Surface le;.5qNext, one surface of the copper foil substrate prepared in [1] above was subjected to plating treatment for roughening. The plating treatment for roughening was performed by electroplating treatment in two stages. For plating treatment for roughening (1), a basic bath composition of a plating solution for roughening as described below was used, and the current density, the liquid temperature, adjustment of liquid flow, the liquid discharge direction and the conveyance speed of the copper foil substrate were set as described in Table 1 below. Further, subsequent plating treatment for roughening (2) was performed under the following plating conditions using the following fixed plating solution composition.

<Basic Bath Composition of Plating Solution for Roughening>
Cu: 60 g/L
$H_2SO_4$: 150 g/L
Mo: 0.03 g/L
Fe: 2 g/L

TABLE 1

|  | Current density (A/dm$^2$) | Liquid temperature (° C.) | Adjustment of liquid flow | Liquid discharge direction | Conveyance speed of copper foil substrate (m/minute) |
|---|---|---|---|---|---|
| Comparative Example 1 | 5 | 20 | Low turbulent flow | One direction | 11~15 |
| Comparative Example 2 | 8 | 20 | Low turbulent flow | One direction | 11~15 |
| Example 1 | 10 | 20 | Low turbulent flow | One direction | 11~15 |
| Example 2 | 15 | 20 | Turbulent flow | Two directions | 11~15 |
| Example 3 | 20 | 20 | Turbulent flow | One direction | 5~10 |
| Example 4 | 20 | 25 | Turbulent flow | Two directions | 5~10 |
| Example 5 | 15 | 25 | Turbulent flow | Two directions | 5~10 |
| Example 6 | 20 | 25 | Turbulent flow | Three directions | 11~15 |
| Example 7 | 20 | 25 | Turbulent flow | One direction | 5~10 |
| Example 8 | 25 | 20 | Low turbulent flow | One direction | 11~15 |
| Example 9 | 25 | 20 | Turbulent flow | Two directions | 11~15 |
| Example 10 | 25 | 25 | Turbulent flow | One direction | 5~10 |
| Comparative Example 3 | 30 | 15 | Turbulent flow | One direction | 5~10 |
| Comparative Example 4 | 30 | 25 | Laminar flow | One direction | 16~25 |
| Comparative Example 5 | 30 | 30 | Laminar flow | One direction | 16~25 |
| Comparative Example 6 | 35 | 35 | Laminar flow | One direction | 16~25 |
| Comparative Example 7 | 25 | 25 | Laminar flow | One direction | 16~25 |

In adjustment of liquid flow in Table 1, the "laminar flow" is a flow in which a fluid moves regularly, and the "turbulent flow" is a flow in which an eddy is produced, and a fluid moves irregularly. Rough distinction between the laminar flow and the turbulent flow is often made generally on the basis of a Reynolds number, but here, the flow is defined as a "laminar flow" when the plating solution for roughening flows dominantly in a direction parallel to the conveyance direction of the copper foil substrate, the flow is defined as a "turbulent flow" when the plating solution flows in a direction other than the direction parallel to the conveyance direction of the copper foil substrate, and the state of a low degree of "turbulent flow" is defined as a "low turbulent flow".

The laminar flow is characterized by a regular flow, and even if the flow is disordered on a temporary basis, the disorder is gradually attenuated, the flow is apt to eventually return to a laminar flow state, and the direction and the intensity of the flow at the same position on the copper foil substrate surface hardly vary. On the other hand, the turbulent flow is characterized by a complicated and irregular flow, and always makes a change in pattern and passes along different routes, and therefore the direction and the intensity of the flow at the same position on the copper foil substrate surface easily vary.

<Fixed Plating Solution Composition>
  Cu: 40 g/L
  H$_2$O$_4$: 100 g/L
  Current density: 8 A/dm$^2$
  Bath temperature: 45° C.

[3] Formation of Underlying Layer and Intermediate Layer

Subsequently, the roughening-treated surface formed in [2] above was plated with Ni, Zn and Cr in this order under the following conditions to form an underlying layer and an intermediate layer.

<Ni Plating>
  Ni: 40 g/L
  H$_3$BO$_3$: 5 g/L
  Bath temperature: 20° C.
  pH: 3.6
  Current density: 0.2 A/dm$^2$
  Treatment time: 10 seconds <Zn plating>
  Zn: 2.5 g/L
  NaOH: 40 g/L
  Bath temperature: 20° C.
  Current density: 0.3 A/dm$^2$
  Treatment time: 5 seconds <Cr Plating>
  Cr: 5 g/L
  Bath temperature: 30° C.
  pH: 2.2
  Current density: 5 A/dm$^2$
  Treatment time: 5 seconds

[4] Formation of Silane Coupling Agent Layer

Finally, a 3-methacryloxypropyltrimethoxysilane aqueous solution having a concentration of 5% by mass was applied onto the intermediate layer (in particular, the outermost Cr-plated layer) formed in [3] above, and dried at 100° C. to form a silane Coupling Agent Layer (Deposited Amount of Silane is 0.005 mg/dm') in Terms of Si Atom).

[Measurement and evaluation]

For the surface-treated copper foils according to Examples and Comparative Examples, measurement, and evaluation of properties were performed as described below. Conditions for evaluation of the properties are as described below. The results are shown in Table 2.

[Particle Height, Particle Width, and Ratio of Particle Height to Particle Width (Particle Height/Particle Width) of Roughening Particles]

The particle height and the particle width of roughening particles were measured by performing image analysis in the following steps (i) to (iv).

First, (i) the surface-treated copper foil was cut to a size of 5 mm square, and embedded in an epoxy resin curable at normal temperature ("Specifics 20" manufactured by Struers), and the epoxy resin was cured at 23° C. for 24 hours to prepare a disc-shaped epoxy resin block including a surface-treated copper foil and having a diameter of 10 mm and a thickness of 0.5 mm. Next, the disc-shaped block was cut along the center line of the block perpendicularly to the roughened surface from the roughened surface side of the surface-treated copper foil, and the cut surface was precisely polished for 1 hour under conditions of a stage mode C5 (swing angle: ±40°, swing speed: 2.3 reciprocations/min) and an accelerating voltage of 6 KV using an ion milling apparatus ("IM 4000 PLUS" manufactured by Hitachi High-Technologies Corporation). The cut surface of the surface-treated copper foil exposed to a surface of the prepared sample for measurement was observed at a magnification of 5000 times using an electron microscope ("S-3000N" manufactured by Hitachi High-Technologies Corporation), and a photograph (SEM image) of a cross-section in the vicinity of the roughened surface was prepared.

Next, (ii) on the cross-section photograph, image processing was performed for emphasizing the contours of roughening particles using image analysis software (open-source free software "ImageJ"), and "binarization" processing was performed for coloring roughening particles in different colors. Thereafter, (iii) image processing for removing noises generated with the "binarization" processing was performed, and image processing for decoloring portions of roughening particles, which had been colored black by the "binarization" processing. Thereafter, (iv) the contour lines of the roughening particles were extracted, and the particle height and the particle width of the roughening particles on the contour lines were each measured using general measurement software (Photo Ruler or the like).

For each of the particle height and the particle width of the roughening particles, an average value and a standard deviation were calculated on the basis of the results of the measurement, and an average value and a standard deviation of the ratio of the particle height to the particle width (particle height/particle width) of the roughening particles were each calculated.

FIGS. 3A to 3D and FIGS. 4A to 4D show an example of SEM images (FIGS. 3A and 4A) of the cross-section observed in step (i) and diagrams (FIGS. 3B to 3D and FIGS. 4B to 4D) showing the images processed by the steps (ii) to (iv) and corresponding, respectively, to the steps, for surface-treated copper foils of Example 5 of the present disclosure and Comparative Example 7.

[Luminance (Brightness Value)]

For the roughened surface of the surface-treated copper foil, the Y value in the XYZ color system specified by CIE was measured using a brightness meter (manufactured by Suga Test Instruments Co., Ltd., model: SM Color Computer, model number: SM-T45).

[High-Frequency Property (Transmission Loss)]

A double-sided copper-clad sheet was prepared by bonding each of the surface-treated copper foils of Examples and Comparative Examples to both surfaces of a 50 μm-thick liquid crystal polymer film (manufactured by Ise Murata Manufacturing Co., Ltd., thickness accuracy: 0.7 μm, relative permittivity: 3.4, dielectric tangent: 0.0020, ratio of maximum value to minimum value of linear thermal expansion coefficient: 1.4) using a thermal welding method. Next, the surface-treated copper foil on one surface of the double-sided copper-clad sheet was set to a signal layer with a linear pattern formed in a linear shape having a predetermined width (110 μm) and a length (20 mm) by an etching method, and the other copper foil was set to a ground layer to prepare a circuit board of micro-strip line structure. Further, the circuit board was dried in a circulation-type oven at 50° C. for 24 hours, and then cooled to room temperature under a standard environment as described in JIS C6481-1996 to prepare a circuit board for evaluation of high-frequency property.

Both ends of the pattern of the thus-prepared circuit board for evaluation were inserted into a probe connector, a high-frequency signal (13 GHz) was fed into the pattern, and the intensity of a signal (S21) passing through the pattern was measured. The measurement was performed using a network analyzer ("ENA E5071C" manufactured by Agilent Technologies) and a probe connector ("PCSMA" manufactured by Yokowo Co., Ltd., DS Department). Further, the measurement was performed five times in the same pattern, and an average value of the measurements was defined as an amount of loss in each circuit board. Further, the amount of loss in each circuit board was converted into an index relative to the amount of loss in Example 5 (100) to calculate an index of transmission loss.

In examples, as an indicator of the high-frequency property, the surface-treated copper foil was rated as being good when the index of transmission loss was 106 or less, and the surface-treated copper foil was rated as being excellent when the index of transmission loss was 102 or less.

[Thickness of Liquid Crystal Polymer Film and Accuracy of Thickness]

First, the liquid crystal polymer film was cut to a size of 10 cm×10 cm to prepare a test piece. Next, the thickness of the test piece at a central part, which is a portion where the relative permittivity and the dielectric tangent are measured, was measured using a digital thickness gauge ("SMD-565" manufactured by Mitutoyo Corporation, tip end diameter of probe: 2 mm). Specifically, the thickness at each of total five points including the center of the test piece, and four points which are the corners of a square centering on the center of the test piece and having a length of 4 cm on each side was measured, and an arithmetic average of the measured values was defined as the thickness of the test piece (the same applies to the thickness of the liquid crystal polymer film below). Further, 20 test pieces were cut out from the same liquid crystal polymer film, the thickness was measured at each of 100 points, and a standard deviation of the measured values was defined as the thickness accuracy.

[Relative Permittivity and Dielectric Tangent of Liquid Crystal Polymer Film]

First, the liquid crystal polymer film was cut to a size of 10 cm×10 cm, dried in a circulation-type oven at 50° C. for 24 hours, and cooled to room temperature under a standard environment as described in JIS C6481-1996 to prepare a test piece for measurement.

A network analyzer (identical to that described above) and a split-post dielectric resonator (manufactured by OWED Company) with a measuring frequency of 3.18 GHz were used. First, a resonance frequency of the resonator alone with no test piece inserted in the resonator, and a Q value of the peak of the resonance frequency were measured. Next, a plurality of test pieces were inserted into the resonator with the test pieces superposed on one another in such a manner that the total thickness of the test pieces was 100 μrte or more, and the resonance frequency and the Q value were then measured with the test pieces inserted in the resonator.

The relative permittivity was calculated from a difference in resonance frequency between the resonator alone and the resonator with the test pieces inserted in the resonator, and the dielectric tangent was calculated from a difference in 0 value and a difference in resonance frequency between the resonator alone and the resonator with the test pieces inserted in the resonator.

[Linear Thermal Expansion Coefficient of Liquid Crystal Polymer Film]

The linear thermal expansion coefficient of the liquid crystal polymer film was determined under the following conditions in conformity with JIS C6481-1996.

First, the liquid crystal polymer film was cut to a size of 4 cm×20 cm to prepare a test piece. Next, the test piece was attached to a thermomechanical measuring apparatus ("0400" manufactured by TA Instruments Japan) in such a manner that the chuck-to-chuck distance was 15 mm, the test piece was heated at a temperature elevation rate of 40° C./min from normal temperature to 170° C. in a tensile mode while a load of 0.1 N was applied, and the test piece was held at 170° C. for 1 minute. Thereafter, the test piece was cooled at a temperature lowering rate of 10° C./min from 170° C. to normal temperature, and a change ΔL in chuck-to-chuck distance as the temperature was lowered from 100° C. to 50° C. was measured. The linear thermal expansion coefficient was calculated from the following equation.

linear thermal expansion coefficient (ppm/° C.)=ΔL/(L×ΔT)

[wherein ΔL is a change (mm) in chuck-to-chuck distance, L is a chuck-to-chuck distance (15 mm), and ΔT is a temperature difference (50° C.)].

The measurement was performed at six points at intervals of 30° in a circumferential direction on a plane of the liquid crystal polymer film, linear thermal expansion coefficients were calculated from the respective values, and a ratio of the maximum value to the minimum value (maximum value/minimum value) among the linear thermal expansion coefficients was determined.

[Adhesion (Peel Strength at 180°)]

The surface-treated copper foil of each of Examples and Comparative Examples was laminated to one surface of a 50 μm-thick liquid crystal polymer film (identical to that described above) in such a manner that the roughened surface of the surface-treated copper foil contacted the liquid crystal polymer film, and as a release material, a polyimide film ("UPILEX 20S" manufactured by Ube Industries, Ltd.) was laminated to the other surface. The resulting laminate was inserted between two 2 mm-thick stainless sheets, and a 1 mm-thick stainless fiber woven fabric as a cushion material was placed on the upper side and the lower side of the stainless sheet, and held with a vacuum pressing machine at 300° C. and a pressure of 3 MPa for 5 minutes to obtain a single-sided copper-clad laminate sheet.

The strength (unit: N/mm) when in conformity with its C6471-1995, the surface-treated copper foil was peeled off in a direction of 180° at a speed of 50 mm/min using a tensile tester ("AGS-H" manufactured by Shimadzu Corporation) was measured.

Specifically, an unnecessary part of the copper foil was etched away by immersing the copper-clad laminate sheet in a ferric chloride solution with a 5 mm-wide masking tape attached to the copper foil side of the copper-clad laminate sheet. Thereafter, the copper-clad laminate sheet was washed with water to peel the masking tape, and dried in a circulation-type oven at 80° C. for 1 hour to form a 5 mm-wide linear circuit pattern. The test piece was attached to a reinforcing sheet having a thickness of 1 mm or more so that the test piece was prevent from bending to change the peeling angle at the time of peeling off the copper foil from the copper-clad laminate sheet. One end of the circuit pattern formed was peeled off, and inserted in the tensile tester, the copper foil was then peeled off by 10 mm or more at a speed of 50 mm/min in a direction of 180° with respect to the test piece, an average value of all the strengths over this range was calculated, and the obtained value was defined as a peel strength (N/mm).

In examples, as an indicator of adhesion, the peel strength at 180° was measured, the surface-treated copper foil was rated as being good when the peel strength at 180° was 0.40 N/mm or more, and the surface-treated copper foil was rated as being excellent when the peel strength at 180° was 0.60 N/mm or more.

[Laser Processability]

A single-sided copper-clad laminate sheet was prepared by bonding a 12 μm-thick surface-treated copper foil to one surface of a 50 μm-thick liquid crystal polymer film (identical to that described above) using a thermal welding method.

Next, the copper-clad laminate sheet was irradiated with carbon dioxide gas laser from the liquid polymer film side of the sheet to form via holes. The laser irradiation was performed under conditions of a pulse width of 1 to 5 μs, a point energy of 1 to 3 mJ, a mask diameter of 1 to 3 mm, and an irradiation frequency of 5 to 10 shots depending on the structure of roughening particles. Further, the via hole diameter was set to 100 μm, and 150 via holes were formed arbitrarily.

After formation of the via holes, the roughened surface of the surface-treated copper foil on the via bottom was observed to examine whether resin residues were present or not. For examination on resin residues, the surface-treated copper foil was etched out after laser processing, and observed at a magnification of 10 times with an optical microscope for examining whether a resin was retained as a film on the via hole bottom part. For each copper-clad laminate sheet, 150 holes were examined, and the number of holes having no resin residues was counted.

In examples, as an indicator of laser processability, the resin residues were examined, the surface-treated copper foil was rated as being good when the number of holes having no resin residues was 40 or more, and the surface-treated copper foil was rated as being excellent when the number of holes having no resin residues was 80 or more.

[Overall Evaluation]

All of the high-frequency property, the adhesion and the laser processability were put together, and overall evaluation was performed on the basis of the following criteria.

<Criteria for Overall Evaluation>

A (Excellent): excellent in all evaluation items

B (Acceptable): good in all evaluation items

C (Unacceptable): there is at least one evaluation item in which the acceptability criterion is not satisfied.

TABLE 2

|  | Roughening particles | | | | | | | Property evaluation | | | |
|---|---|---|---|---|---|---|---|---|---|---|---|
|  | Particle height | | Particle width | | Particle height/ particle width | | | | Peel strength at 180° (N/mm) | Laser processability [count] | Overall evaluation |
|  | Average value (μm) | Standard deviation (μm) | Average value (μm) | Standard deviation (μm) | Average value | Standard deviation | Luminance | Transmission loss index | | | |
| Comparative Example 1 | 0.45 | 0.13 | 0.20 | 0.12 | 2.30 | 0.80 | 15.0 | 93 | 0.23 | 10 | C |
| Comparative Example 2 | 0.52 | 0.16 | 0.33 | 0.17 | 1.92 | 0.88 | 14.2 | 96 | 0.37 | 30 | C |
| Example 1 | 0.49 | 0.17 | 0.27 | 0.15 | 2.35 | 1.12 | 12.0 | 98 | 0.58 | 40 | B |
| Example 2 | 0.55 | 0.16 | 0.27 | 0.13 | 2.30 | 0.81 | 13.3 | 99 | 0.56 | 60 | B |
| Example 3 | 0.58 | 0.20 | 0.31 | 0.17 | 2.35 | 0.92 | 14.0 | 102 | 0.54 | 70 | B |
| Example 4 | 0.71 | 0.24 | 0.34 | 0.18 | 2.66 | 1.49 | 13.6 | 101 | 0.67 | 90 | A |
| Example 5 | 0.62 | 0.22 | 0.21 | 0.11 | 3.51 | 1.49 | 11.4 | 100 | 0.67 | 100 | A |
| Example 6 | 0.75 | 0.26 | 0.25 | 0.19 | 3.78 | 1.89 | 10.3 | 102 | 0.72 | 100 | A |
| Example 7 | 0.89 | 0.28 | 0.30 | 0.21 | 3.50 | 1.33 | 13.3 | 102 | 0.78 | 105 | A |
| Example 8 | 0.74 | 0.27 | 0.27 | 0.25 | 2.74 | 2.05 | 12.1 | 101 | 0.58 | 80 | B |
| Example 9 | 0.94 | 0.29 | 0.26 | 0.24 | 3.90 | 1.22 | 12.9 | 103 | 0.59 | 90 | B |
| Example 10 | 1.23 | 0.27 | 0.32 | 0.22 | 3.67 | 1.36 | 13.8 | 105 | 0.70 | 100 | B |
| Comparative Example 3 | 1.17 | 0.30 | 0.26 | 0.25 | 4.08 | 1.25 | 14.1 | 106 | 0.38 | 80 | C |
| Comparative Example 4 | 1.25 | 0.33 | 0.53 | 0.28 | 2.55 | 1.18 | 14.3 | 108 | 0.82 | 110 | C |
| Comparative Example 5 | 1.41 | 0.36 | 0.69 | 0.31 | 2.44 | 1.15 | 15.0 | 119 | 0.85 | 120 | C |
| Comparative Example 6 | 2.68 | 0.89 | 0.96 | 0.39 | 2.99 | 0.71 | 19.0 | 129 | 0.95 | 150 | C |
| Comparative Example 7 | 0.68 | 0.19 | 0.38 | 0.2 | 2.19 | 1.10 | 16.5 | 100 | 0.28 | 10 | C |

Note:
bold and underlined values in the table are values which are outside the proper range in the present disclosure, and values which do not satisfy the acceptability criteria in examples as indicators of evaluation results.

Since the surface-treated copper foil of each of Examples 1 to 10 was controlled so that observation of a cross-section of the surface-treated copper foil with SEM showed that on the roughened surface, the standard deviation of the particle height of roughening particles was within the range of 0.16 μm or more and 0.30 μm or less, and the ratio of the particle height to the particle width (particle height/particle width) of roughening particles was within the range of 2.30 or more and 4.00 or less as shown in Table 2 above, the surface-treated copper foil was confirmed to have both a favorable high-frequency property and favorable adhesion and have favorable laser processability. Particularly, in each of Examples 4 to 7, it was possible to obtain a surface-treated copper foil excellent in all of a high-frequency property, adhesion and laser processability.

On the other hand, since the surface-treated copper foil of each of Comparative Examples 1 to 7 was not controlled so that on the roughened surface, the standard deviation of the particle height of roughening particles was within the range of 0.16 μm or more and 0.30 μm or less, and the ratio of the particle height to the particle width (particle height/particle width) of roughening particles was within the range of 2.30 or more and 4.00 or less, the surface-treated copper foil was confirmed to be inferior in at least one of a high-frequency property, adhesion and laser processability to the surface-treated copper foils of Examples 1 to 10.

What is claimed is:

1. A surface-treated copper foil comprising a copper foil substrate, at least one surface of which has a surface treatment coat including at least a roughening-treated surface on which roughening particles are formed, wherein observation of a cross-section of the surface-treated copper foil with a scanning electron microscope shows that on a surface of the surface treatment coat, a standard deviation of the particle height of the roughening particles is 0.16 μm or more and 0.30 μm or less, and an average value of a ratio of the particle height to the particle width (particle height/particle width) of the roughening particles is 2.30 or more and 4.00 or less.

2. A surface-treated copper foil comprising a copper foil substrate, at least one surface of which has a surface treatment coat including at least a roughening-treated surface on which roughening particles are formed, wherein observation of a cross-section of the surface-treated copper foil with a scanning electron microscope shows that on a surface of the surface treatment coat, a standard deviation of the particle height of the roughening particles is 0.16 μm or more and 0.30 μm or less, and an average value of a ratio of the particle height to the particle width (particle height/particle width) of the roughening particles is 2.30 or more and 4.00 or less, and an average value of the particle height of the roughening particles is 0.50 μm or more and 1.20 μm or less.

3. A surface-treated copper foil comprising a copper foil substrate, at least one surface of which has a surface treatment coat including at least a roughening-treated surface on which roughening particles are formed, wherein observation of a cross-section of the surface-treated copper foil with a scanning electron microscope shows that on a surface of the surface treatment coat, a standard deviation of the particle height of the roughening particles is 0.16 μm or more and 0.30 μm or less, and an average value of a ratio of the particle height to the particle width (particle height/particle width) of the roughening particles is 2.30 or more and 4.00 or less, and an average value of the particle height of the roughening particles is 0.50 μM or more and 1.20 μm or less, and a standard deviation of the ratio of the particle height to the particle width (particle height/particle width) of the roughening particles is 1.20 or more and 2.00 or less.

4. The surface-treated copper foil according to claim 2, wherein on the surface of the surface treatment coat, a luminance is 10.0 or more and 14.0 or less.

5. The surface-treated copper foil according to claim 3, wherein on the surface of the surface treatment coat, a luminance is 10.0 or more and 14.0 or less.

6. The surface-treated copper foil according to claim 1, wherein the surface-treated copper foil is used for a high-frequency band printed wiring board.

7. The surface-treated copper foil according to claim 2, wherein the surface-treated copper foil is used for a high-frequency band printed wiring board.

8. The surface-treated copper foil according to claim 3, wherein the surface-treated copper foil is used for a high-frequency band printed wiring board.

9. A copper-clad laminate sheet comprising the surface-treated copper foil according to claim 1.

10. A copper-clad laminate sheet comprising the surface-treated copper foil according to claim 2.

11. A copper-clad laminate sheet comprising the surface-treated copper foil according to claim 3.

12. The copper-clad laminate sheet according to claim 9, wherein a resin of a resin base material of the copper-clad laminate sheet is a liquid crystal polymer.

13. The copper-clad laminate sheet according to claim 10, wherein a resin of a resin base material of the copper-clad laminate sheet is a liquid crystal polymer.

14. The copper-clad laminate sheet according to claim 11, wherein a resin of a resin base material of the copper-clad laminate sheet is a liquid crystal polymer.

15. A printed wiring board comprising the copper-clad laminate sheet according to claim 9.

16. A printed wiring board comprising the copper-clad laminate sheet according to claim 10.

17. A printed wiring board comprising the copper-clad laminate sheet according to claim 11.

18. A printed wiring board comprising the copper-clad laminate sheet according to claim 12.

19. A printed wiring board comprising the copper-clad laminate sheet according to claim 13.

20. A printed wiring board comprising the copper-clad laminate sheet according to claim 14.

* * * * *